United States Patent [19]

Goenka

[11] Patent Number: 5,616,067
[45] Date of Patent: Apr. 1, 1997

[54] $CO_2$ NOZZLE AND METHOD FOR CLEANING PRESSURE-SENSITIVE SURFACES

[75] Inventor: Lakhi N. Goenka, Ann Arbor, Mich.

[73] Assignee: Ford Motor Company, Dearborn, Mich.

[21] Appl. No.: 585,987

[22] Filed: Jan. 16, 1996

[51] Int. Cl.[6] .................................................. B24C 5/04
[52] U.S. Cl. .................. 451/39; 451/101; 451/99; 451/100; 451/75; 239/318; 239/499; 239/594
[58] Field of Search ............................ 451/99–102, 39, 451/75; 239/318, 499, 594

[56] References Cited

U.S. PATENT DOCUMENTS

| | | |
|---|---|---|
| 3,676,963 | 7/1972 | Rice et al. . |
| 3,878,978 | 4/1975 | Martinek . |
| 4,038,786 | 8/1977 | Fong . |
| 4,111,362 | 9/1978 | Cater, Jr. . |
| 4,389,820 | 7/1983 | Fong et al. . |
| 4,415,107 | 11/1983 | Palmieri . |
| 4,519,812 | 5/1985 | Brull et al. . |
| 4,545,155 | 10/1985 | Nakata . |
| 4,631,250 | 12/1986 | Hayashi . |
| 4,640,460 | 2/1987 | Franklin, Jr. . |
| 4,747,421 | 5/1988 | Hayashi . |
| 4,806,171 | 2/1989 | Whitlock et al. . |
| 4,813,611 | 3/1989 | Fontana . |
| 4,828,184 | 5/1989 | Gardner et al. . |
| 4,932,168 | 6/1990 | Tada et al. . |
| 4,962,891 | 10/1990 | Layden . |
| 5,018,667 | 5/1991 | Lloyd . |
| 5,025,597 | 6/1991 | Tada et al. . |
| 5,035,750 | 7/1991 | Tada et al. . |
| 5,050,805 | 9/1991 | Lloyd et al. . |
| 5,062,898 | 11/1991 | McDermott et al. . |
| 5,074,083 | 12/1991 | Kanno et al. . |
| 5,107,764 | 4/1992 | Gasparrini . |
| 5,111,984 | 5/1992 | Niedbala . |
| 5,125,979 | 6/1992 | Swain et al. . |
| 5,209,028 | 5/1993 | McDermott et al. . |
| 5,294,261 | 3/1994 | McDermott et al. . |
| 5,315,793 | 5/1994 | Peterson et al. . |
| 5,354,384 | 10/1994 | Sneed et al. . |
| 5,365,699 | 11/1994 | Armstrong et al. . |
| 5,390,450 | 2/1995 | Goenka . |
| 5,395,454 | 3/1995 | Robert . |
| 5,405,283 | 4/1995 | Goenka . |
| 5,409,418 | 4/1995 | Krone-Schmidt et al. . |
| 5,431,740 | 7/1995 | Swain . |
| 5,445,553 | 8/1995 | Cryer et al. . |
| 5,456,629 | 10/1995 | Bingham ............................ 451/102 |

*Primary Examiner*—Robert A. Rose
*Assistant Examiner*—George Nguyen
*Attorney, Agent, or Firm*—Richard D. Dixon

[57] ABSTRACT

In an apparatus for cleaning a workpiece with abrasive $CO_2$ particles, a $CO_2$ nozzle receives and expels liquid $CO_2$ through at least one orifice sized for at least partially converting the liquid into $CO_2$ particles. The $CO_2$ particles are injected into a converging-diverging nozzle at a location adjacent to the throat section thereof. Pressurized air is directed into the converging section of the nozzle upstream from the throat section. The pressurized air accelerates the $CO_2$ particles which are focused by the diverging section of the nozzle for impacting the pressure-sensitive surface of the workpiece to be cleaned.

20 Claims, 3 Drawing Sheets

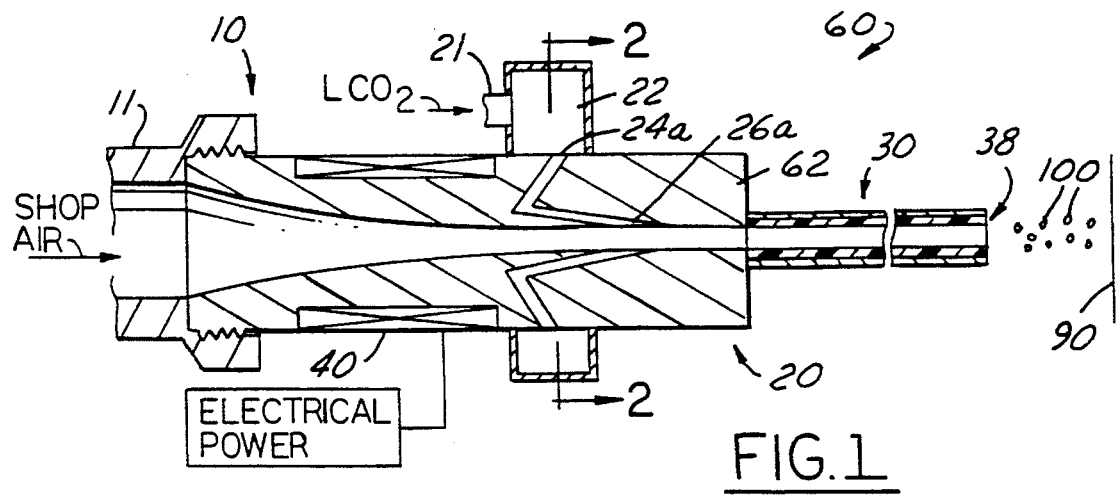
FIG. 1
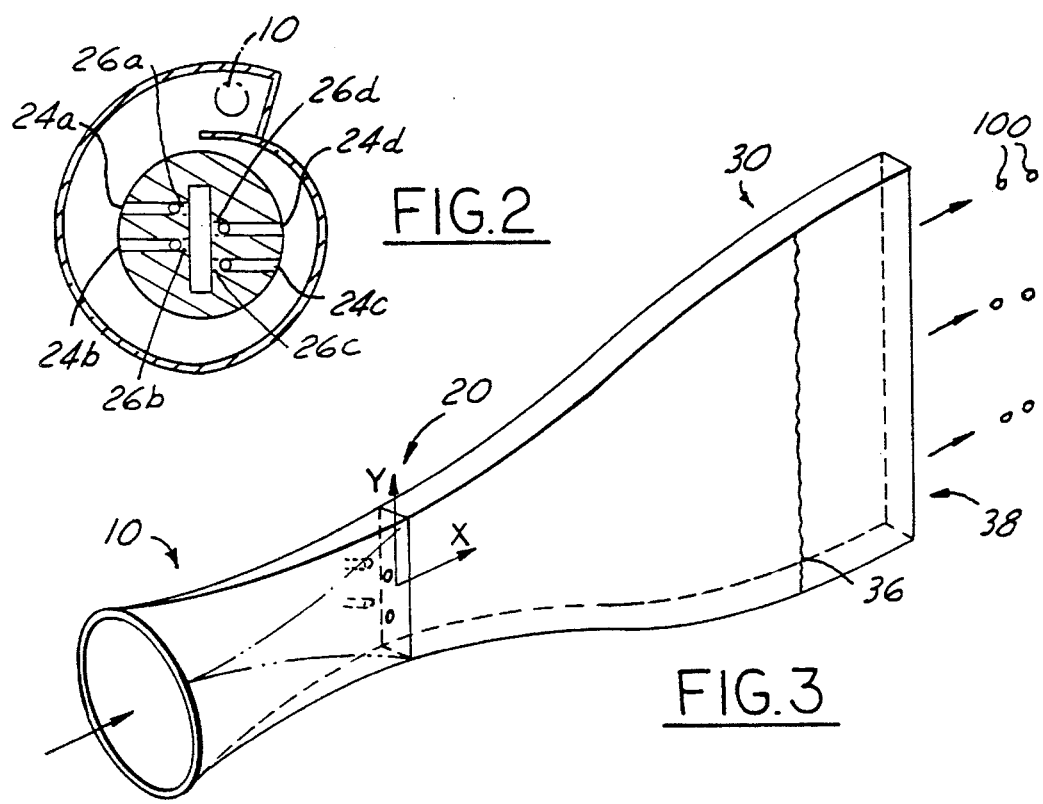
FIG. 2
FIG. 3
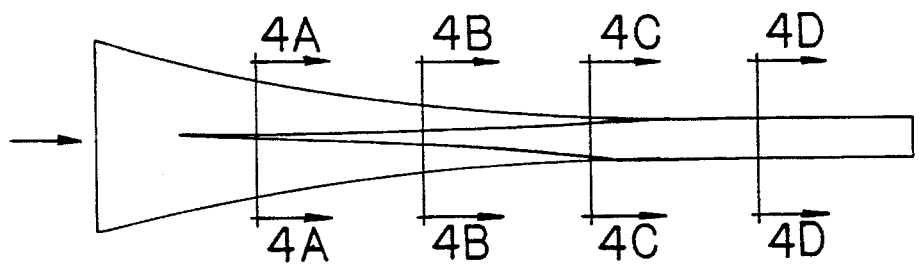
FIG. 4

CO₂ NOZZLE AND METHOD FOR CLEANING PRESSURE-SENSITIVE SURFACES

FIELD OF THE INVENTION

The present invention relates to an apparatus and method for creating abrasive $CO_2$ particles and for directing the resulting $CO_2$ particles onto a large area of contaminants to be removed from a pressure-sensitive workpiece.

BACKGROUND OF THE INVENTION

The use of liquid carbon dioxide for producing $CO_2$ particles and subsequently accelerating it to high speeds for cleaning particles from a substrate is taught by Layden in U.S. Pat. No. 4,962,891.

Lloyd, in U.S. Pat. No. 5,018,667 at columns 5 and 7, teaches the use of multiple nozzles and tapered concentric orifices for controlling the flow of the $CO_2$ and the snow mixture. This reference seeks to disperse the snow rather than to focus it after exiting the exhaust nozzle.

Hayashi, in U.S. Pat. Nos. 4,631,250 and 4,747,421, discloses the use of liquefied nitrogen ($N_2$) for cooling a jacket-type peripheral wall defining a sealed cavity in which a flow of $CO_2$ gas is introduced under pressure. The cooling produced by the cooled peripheral walls causes the $CO_2$ to change into snow within the chamber. Nitrogen gas is introduced into the chamber at high pressure in order to agitate and carry the $CO_2$ particles from the chamber at high velocity though a jetting nozzle.

My U.S. Pat. No. 5,405,283 teaches the use of relatively low pressure shop air for transporting and agglomerating $CO_2$ particles through a converging-diverging nozzle and onto a large workpiece to be cleaned. The larger $CO_2$ snow/flakes, produced by the enhanced mixing action upstream from the throat, are useful for aggressively cleaning contaminants from a sturdy workpiece, but are not well suited for cleaning contaminants from pressure-sensitive surfaces because the mass and momentum of the $CO_2$ particles will cause pitting or denting in pressure-sensitive surfaces.

My U.S. Pat. No. 5,390,450 discloses a converging-diverging nozzle for directing $CO_2$ particles onto a workpiece. The diverging portion of the nozzle is operated in the overexpanded mode for reducing the noise produced by the shockwave by retaining it within the nozzle.

In contrast to these prior art teachings, the present invention utilizes inexpensive components and readily available low pressure shop air for accelerating relatively small $CO_2$ particles that are injected directly adjacent to the throat section of a converging-diverging nozzle. It is therefore an object of the present invention to utilize low pressure air for transporting and directing the small $CO_2$ particles against pressure-sensitive surfaces to be cleaned.

SUMMARY OF THE INVENTION

In an apparatus for cleaning a workpiece with abrasive $CO_2$ particles, a $CO_2$ nozzle is provided for receiving and expelling liquid $CO_2$ through at least one orifice sized for at least partially converting the liquid into $CO_2$ particles. The $CO_2$ particles are injected into a converging-diverging nozzle at a location adjacent to the throat section thereof. Pressurized air is directed into the converging section of the nozzle upstream from the throat section. The pressurized air and $CO_2$ particles are accelerated by the airflow through the throat section and are focused by the diverging section of the nozzle for impacting the pressure-sensitive surface of the workpiece to be cleaned.

BRIEF DESCRIPTION OF THE DRAWINGS

Other objects, features and advantages of the present invention will be apparent from a study of the written descriptions and the drawings in which:

FIG. 1 is a top cross-sectioned view of the $CO_2$ cleaning nozzle in accordance with the present invention as it operates on a workpiece, such as a pressure-sensitive printing stencil.

FIG. 2 is an end cross-sectioned view of the first preferred embodiment of the $CO_2$ cleaning nozzle taken along section lines 2—2 in FIG. 1.

FIG. 3 is a simplified perspective view of the interior surfaces of the converging-diverging nozzle in accordance with a first preferred embodiment of the present invention. Hidden lines and cutaway sections reveal the shapes of the interior dimensions of the nozzle.

FIG. 4 is a top view of the converging section of the nozzle.

DESCRIPTION OF THE PREFERRED EMBODIMENT AND METHOD

Figure 4A:
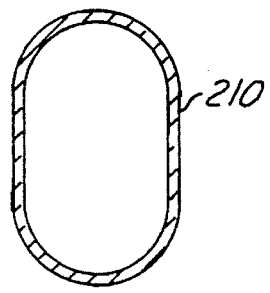
FIGS. 4A, 4B, 4C and 4D are cross-sectioned views taken along the respective section lines in FIG. 4.
Figure 4B:
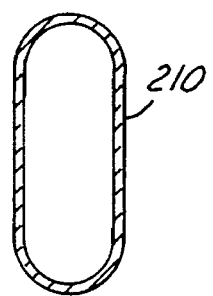
Figure 4C:
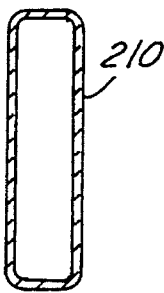
Figure 4D:
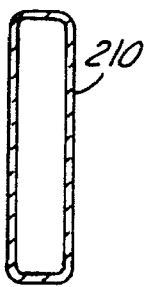

A $CO_2$ cleaning system in accordance with the present invention is illustrated generally in FIG. 1. A $CO_2$ feed line 21 is connected to a reservoir (not shown) of liquid $CO_2$. A source of compressed shop air (not shown) is connected through a feed line to an inlet section 11 of a converging/diverging nozzle. The solid $CO_2$ particles 100 which are exhausted from the $CO_2$ cleaning system are focused on the workpiece 90, shown generally as a thin (0.008 inches thick) stencil of the type used for applying solder paste to a printed circuit board. Other potential applications include the cleaning of fixtures and stencils used in the printing industry, as well as cleaning of sensitive print heads and electronic components. The size of the $CO_2$ particles 100 and the workpiece 90 are enlarged for purposes of clarity and do not necessarily represent the size of the $CO_2$ footprint on the stencil.

The reservoir of liquid $CO_2$ is stored at approximately 0° F. and is pumped under a pressure of approximately 200–350 psi through the feed-line 21, through a control valve (not shown) and then into a $CO_2$ plenum chamber 22. The control valve regulates the pressure and the flow rate under which the liquid $CO_2$ is fed into the $CO_2$ plenum, which in turn regulates the amount of snow in the output flow.

The source of "shop air" generally comprises an air compressor and reservoir of the type normally found in a manufacturing or production environment. The air compressor is capable of pumping a large volume of air, typically 200 cfm at room temperature, through a feedline 11. A control valve (not shown) is interposed along the feedline 11 for regulating the pressure and flow rate of the air from the shop air reservoir. The use of existing shop air in the pressure range of 30 psi to 120 psi significantly reduces the capital and operating costs for the present system.

With continuing reference to FIG. 1, a converging-diverging $CO_2$ nozzle 60 includes a body 62 defining therein a converging section 10 having an input section with a diameter of approximately 0.5 to 2 inches, with 1 inch being used in the preferred embodiment. The converging section 10 is approximately 5 inches long, and is tapered from a circular inlet to a rectangular throat section 20, as illustrated in FIGS. 4, 4A, 4B, 4C and 4D.

As illustrated in FIG. 2, the feed-line 21 carrying the liquid $CO_2$ from the reservoir is coupled into the tapered, annular $CO_2$ plenum or manifold 22 of decreasing cross-sectional area that provides the liquid $CO_2$ under equal pressure into four $CO_2$ channels 24a, b, c and d. Each of the four $CO_2$ channels opens into a section of the converging section 10 of the nozzle 60 through a $CO_2$ orifice 26 immediately adjacent to the throat 20. The orifices 26a, 26b, 26c and 26d are staggered generally around the circumference of the body 62. Whereas the inside dimensions of the throat 20 are approximately 0.2 inches by 1.0 inch, the $CO_2$ orifices 26 are only approximately 0.030 inches in diameter. The $CO_2$ channels 24 are angled at 25° with respect to the longitudinal axis of the nozzle body 62 so that when the liquid $CO_2$ is expelled through the orifices 26a, b, c and d, the resulting $CO_2$ solid particles will have some forward velocity toward the diverging section 30. The exact angle at which the $CO_2$ particles are expelled through the $CO_2$ orifices 26 will vary by design, but is between approximately 10° and 45° with respect to the central flow axis.

If the shop air used to pressurize and move the $CO_2$ particles through the nozzle 60 happens to contain any water vapor, then it will freeze on the inside surfaces of the converging section 10 and the throat section 20 of the body 62 defining the nozzle 60. This ice causes a disruption in the laminar flow through the nozzle. The progressive build-up of the ice can, if not corrected, eventually lead to a complete obstruction or closing of the nozzle. This problem can be corrected either by using a dryer to remove any water vapor from the shop air before it enters the shop air feedline 11, or by heating the surfaces of the body 62 where the ice tends to form.

For this purpose, the first preferred embodiment illustrated in FIG. 1 includes an electrical resistance heating surface 40 that is wrapped around the exterior circumference of the body 62. Since the flashing of the liquid $CO_2$ into solid $CO_2$ particles will remove heat from the brass body 62, the electrical resistance heating wrap 40 will serve to maintain the temperature of the body 62 above 32° F. so that ice will not form inside the nozzle 60. A thermocouple (not shown) is attached to the body 62 for automatically controlling the temperature.

The method for generating the $CO_2$ solid particles will now be explained with continuing reference to FIGS. 1, 2 and 3. The liquid $CO_2$ is pumped from the reservoir through the feedline 21 under a pressure controlled by the control valve. The liquid $CO_2$ is forced under a pressure of approximately 300 psi, a temperature of approximately 0° F. and a flow rate of approximately 1.2 gallons per minute through the annular plenum 22, the channels 24 and out the orifices 26, and thereby "flashes" from the liquid state into a state that includes a solid form of $CO_2$, which herein is referred generally as $CO_2$ particles. The $CO_2$ particles will be mixed with either liquid $CO_2$ or $CO_2$ in the gaseous form depending on the combination of temperature and pressure as illustrated in the enthalpy diagram of FIG. 6. In the preferred mode of operation, this combination of characteristics is illustrated as point 1 in the enthalpy diagram of FIG. 6. As the liquid $CO_2$ exits the orifices 26, it will move to point 2A on the enthalpy diagram. It will be understood by one skilled in the art that point 2A may be transferred further into the area in which the exiting $CO_2$ is in the solid and gaseous phase by increasing the pressure differential between the pressure of the liquid $CO_2$ and the pressure of the gas within the converging section 10.

Figure 6:
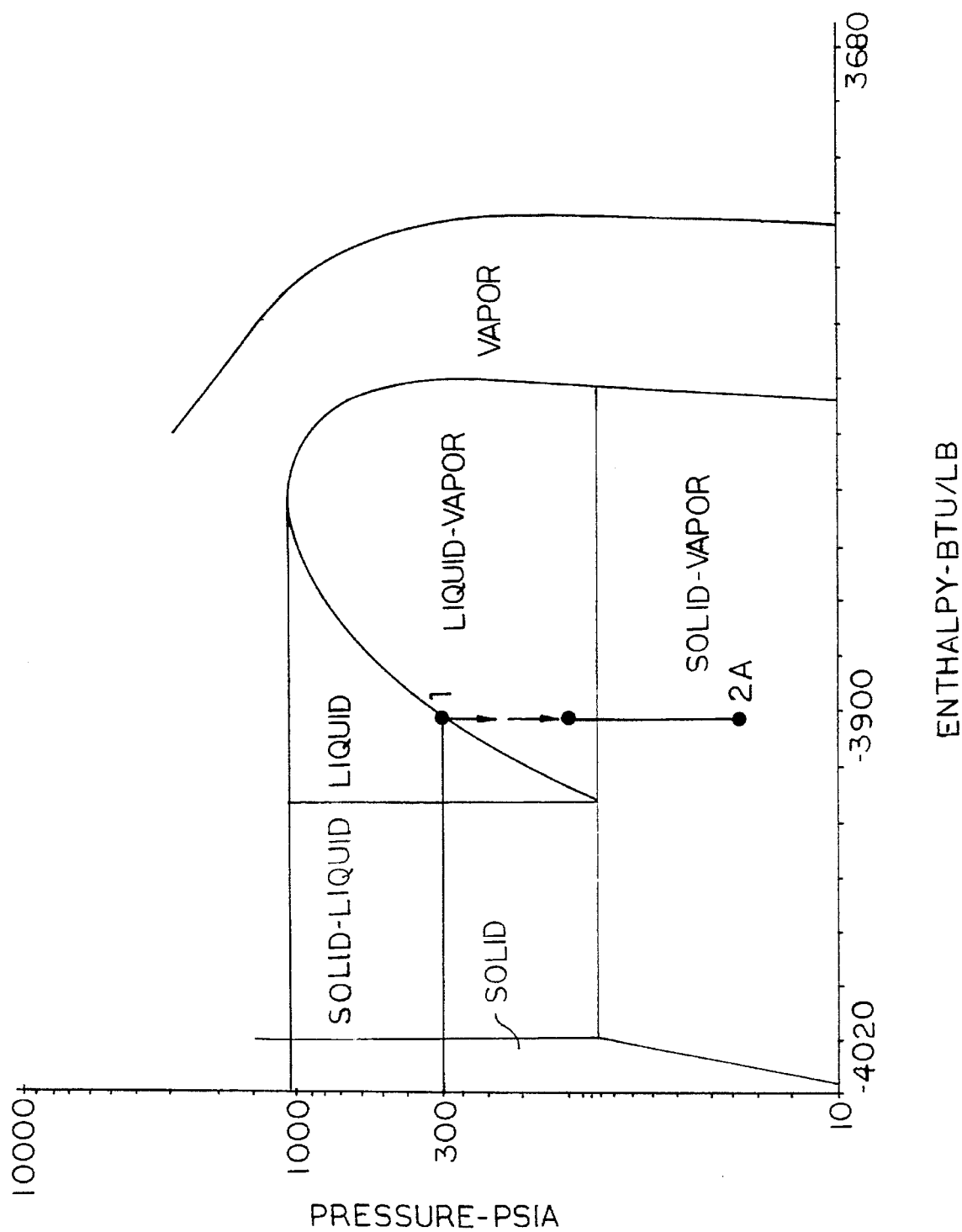
FIG. 6 is an enthalpy diagram showing the transition or flashing of the liquid $CO_2$ into solid $CO_2$ particles in accordance with the operation of the method of the present invention.

As illustrated in FIG. 6, the ratio of solid to gaseous $CO_2$ produced by the nozzle 60 is approximately 50% to 50% for these preferred operating characteristics. As previously explained, these solid $CO_2$ particles are quite small and have a significantly reduced mass when compared to other $CO_2$ pellet and $CO_2$ particles systems.

With reference to FIG. 3, the mixture of $CO_2$ particles and gas from the orifices 26 near the throat section 20 are exhausted toward the diverging section 30. The diverging section 30 expands the stream adiabatically (and approximately isentropically) to the ambient pressure. Further conversion of any remaining liquid $CO_2$ into $CO_2$ particles may occur during this expansion.

As illustrated in FIG. 3, the converging section 10 includes a generally cylindrical section that ms sized for coupling with the shop air feedline 11. The cylindrical section is approximately 1.0 inches in inside diameter, and the converging section 10 tapers over a length of approximately 5 inches to the throat section 20 that has a generally rectangular cross section approximately 0.9 inches by 0.2 inches. This compound tapering shape causes a decrease in the pressure of the shop air flowing therethrough. The throat section 20 forms the narrowest section of the body 62 and opens into the diverging section 30 that defines the generally rectangular exhaust aperture 38 through which the solid $CO_2$ particles and gases flow as they are directed toward the workpiece 90.

The converging section 10 is manufactured of brass and is designed to contain and channel the subsonic flow of the shop air flowing therethrough. The diverging section 30 is designed to accelerate the shop air to a supersonic flow through the exhaust aperture 38.

The contour or curvature of the inside surface of the subsonic converging section 10 is designed according to the matched-cubic design procedure described by Thomas Morel in "Design of 2-D Wind Tunnel Contractions", Journal of Fluids Engineering, 1977, vol. 99. According to this design, the shop air flows at subsonic speeds of approximately 10 to 1100 feet per second at ambient temperatures of from 50° F. to +100° F. as it converges at the throat section 20.

The diverging supersonic section 30 can operate in the overexpanded mode, which retains a normal shockwave 36 within the diverging section 30 in order to reduce the noise by about 120 to 105 db outside the nozzle 60.

The exact contour of the diverging section 30 is more particularly defined with reference to the table of dimensions as follows:

Coordinates of Supersonic Nozzle Contour
Throat Height = 0.904 in.
Nozzle Depth = 0.2 in.

| x (in.) | y (in.) |
| --- | --- |
| 0.000 | 0.452 |
| 0.377 | 0.454 |
| 0.753 | 0.461 |
| 1.130 | 0.473 |
| 1.507 | 0.490 |
| 1.883 | 0.511 |
| 2.260 | 0.537 |
| 2.637 | 0.565 |
| 3.013 | 0.603 |
| 3.390 | 0.641 |
| 3.767 | 0.678 |
| 4.143 | 0.716 |
| 4.520 | 0.754 |
| 4.897 | 0.791 |
| 5.273 | 0.829 |
| 5.650 | 0.867 |
| 6.027 | 0.904 |
| 6.403 | 0.942 |
| 6.780 | 0.980 |
| 7.157 | 1.017 |
| 7.533 | 1.055 |
| 7.910 | 1.093 |
| 8.287 | 1.130 |
| 8.663 | 1.168 |
| 9.040 | 1.206 |
| 9.417 | 1.243 |
| 9.793 | 1.281 |
| 10.170 | 1.319 |
| 10.547 | 1.356 |
| 10.923 | 1.394 |
| 11.300 | 1.432 |
| 11.677 | 1.469 |
| 12.053 | 1.507 |

In the first preferred embodiment of the present invention, the shop air, carbon dioxide gas, and $CO_2$ particle mixture exiting from the exhaust aperture 38 have a temperature of approximately $-50°$ F. to $-200°$ F. and a velocity of approximately as high as 2,000 feet per second. The output mixture is approximately 20–40% by mass of solid $CO_2$ particles, which have a mean particle size of less than 0.001 inches. The diverging section 30 was designed for an inlet pressure of approximately 100 psi. The $CO_2$ particles exit with a generally uniform distribution across the exhaust aperture 38. There is little or no coagulation and agglomeration within the throat section 20 and the diverging section 30.

The exhaust aperture 38 is designed to be approximately 0.5 to 4 inches from the workpiece 90. The angle of attack of the $CO_2$ particles against the workpiece 90 can be varied from 0° to 90°, with an angle of attack of approximately 30° to 60° being preferred for most cleaning operations.

The method of operation of the $CO_2$ cleaning system will now be explained. Point 1 on FIG. 6 represents the state of the saturated liquid $CO_2$ within the $CO_2$ manifold 22 supplied at a pressure of 300 psi and a temperature of approximately 0° F. Assuming a shop air pressure of approximately 100 psi and an ambient temperature of approximately 75° F., Point 2A represents a $CO_2$ partial pressure of approximately 30 psi and indicates the state of the $CO_2$ after flashing through the orifices 26. The $CO_2$ exiting the throat section 20 comprises $CO_2$ in both the solid and gaseous phases having a temperature of approximately $-120°$ F. The relative levels of solid and gaseous $CO_2$ produced can be controlled by adjusting the pressure of the shop air in the converging section 10, as well as by adjusting the ratio of $CO_2$ and air used.

The high relative velocity between the shop air and $CO_2$ streams causes the $CO_2$ stream to atomize into small solid particles, thereby limiting the size of the solid—$CO_2$ particles produced.

The $CO_2$ particles produced by the first preferred embodiment of the present invention were directed at a solder printing stencil (8" by 14") of the type used in applying reflow solder paste for screen printing of printed circuit boards. The stencil, having a thickness of about 0.008 inches, had a coating of solder paste approximately 0.010 inches in thickness, and had been through numerous soldering application cycles in a manufacturing environment. At a shop air pressure of approximately 100 psi, the solder paste was completely cleaned from the 112 square inch surface in about 25 seconds. While commercially available $CO_2$ pellet cleaning systems are capable of removing the accumulated solder paste, they will cause "peens" and "dimples" in the pressure sensitive surface, whereas in the preferred embodiments of the present invention no permanent deformation of the surface will result.

Figure 5:
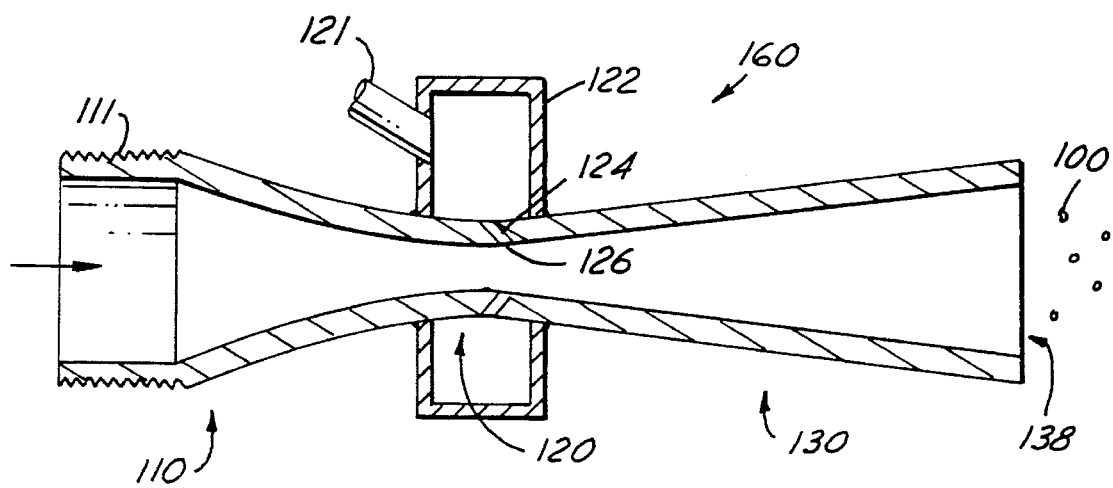
FIG. 5 is a frontal cross-sectioned view of a $CO_2$ cleaning nozzle in accordance with a second preferred embodiment of the present invention.

A second embodiment of the $CO_2$ particle generating nozzle, illustrated generally as 160 in FIG. 5, used in conjunction with the shop air system described above. The second preferred embodiment of the converging/diverging nozzle 160 is the same in most respects as the first preferred embodiment 60, except that the $CO_2$ plenum 122 is located more downstream so as to place the four $CO_2$ channels 124 and four $CO_2$ orifices 126 downstream of the throat section 120 defined within the body 162. The size of the $CO_2$ orifices 126 has been retained at approximately 0.030 inches, but the angle to the flow axis is approximately 40° but can range from 20°–70°.

In this manner, the mean size of the $CO_2$ particles generated by the liquid $CO_2$ passing through the $CO_2$ channels 124 and out the $CO_2$ orifices 126 will be less than 0.001 inches, which is slightly smaller than the $CO_2$ particles produced by the first preferred embodiment. These $CO_2$ particles are slightly smaller because the liquid $CO_2$ is injected adjacent to but downstream of the throat section 120 into a lower pressure but high velocity section of the diverging section 130 of the nozzle 160. This higher relative velocity of the $CO_2$ particles results in better atomization of the $CO_2$ stream, which in turn results in the smaller size of the $CO_2$ particles. This downstream injection could create a secondary shockwave upstream of the injection plane, but does not result in any reduction in the airflow through the throat section 120 of the nozzle 160, as occurs in the first preferred embodiment of the nozzle 60.

In either preferred embodiment, the four staggered $CO_2$ orifices 26 and 126 can be enlarged to one or more continuous slots (not illustrated) that would enable more $CO_2$ particles to be generated. This use of slots instead of apertures would be more difficult to manufacture, and therefore this slot construction is not preferred.

In responding to the requirements of unusual cleaning applications, the diverging section 30 or 130 of the nozzle 60 or 160 may be shortened or even truncated to a point adjacent to the throat section 20 or 120 under circumstances where reduced $CO_2$ particle speeds and a smaller $CO_2$ particle footprint are acceptable.

While the term "shop air" has been used to described the carrier gas, gaseous Nitrogen ($N_2$) or other equivalent gasses could also be used in place of the shop air if required by the special application.

While the present invention has been particularly described in terms of specific embodiments thereof, it will be understood that numerous variations of the invention are within the skill of the art and yet are within the teachings of the technology and the invention herein. Accordingly, the present invention is to be broadly construed and limited only by the scope and spirit of the following claims.

I claim:

1. An apparatus for cleaning a workpiece with abrasive $CO_2$ particles, comprising:
   a first nozzle having a converging section for being coupled to and receiving a pressurized source of carrier gas, a throat section coupled to said converging section for accelerating the carrier gas to near sonic speeds, and a diverging section coupled to said throat section for receiving and accelerating the carrier gas to supersonic speeds toward the workpiece to be cleaned, and
   $CO_2$ injection means, coupled to said first nozzle, for receiving and injecting liquid $CO_2$ into the flow of the carrier gas adjacent said throat section and for simultaneously converting at least a portion of the liquid $CO_2$ into $CO_2$ particles, whereby said $CO_2$ particles are accelerated with the carrier gas before impacting and cleaning the pressure sensitive workpiece.

2. The $CO_2$ cleaning apparatus as described in claim 1 wherein said carrier gas is shop air at a pressure of 30 psi and 120 psi.

3. The $CO_2$ cleaning apparatus as described in claim 1 wherein said $CO_2$ injection means comprises an orifice in said first nozzle spaced operatively upstream from said throat section toward said converging section, whereby the $CO_2$ particles are injected into and accelerated with the carrier gas flowing through said throat section thereof.

4. The $CO_2$ cleaning apparatus as described in claim 1 wherein said $CO_2$ injection means comprises an orifice in said first nozzle spaced operatively downstream from said throat section toward said diverging section, whereby the $CO_2$ particles are injected into the carrier gas after being accelerated through said throat section thereof.

5. The $CO_2$ cleaning apparatus as described in claim 1 wherein said $CO_2$ particles average less than 0.001 inches in diameter.

6. The $CO_2$ cleaning apparatus as described in claim 1 wherein said $CO_2$ particles are injected at an acute angle of less than 25° with respect to a longitudinal axis of flow of the carrier gas through said first nozzle.

7. The $CO_2$ cleaning apparatus as described in claim 1 wherein said $CO_2$ injection means includes at least 2 orifices for injecting at least 2 streams of $CO_2$ particles into the carrier gas.

8. A system for cleaning a pressure-sensitive workpiece with abrasive $CO_2$ particles, comprising;
   a first nozzle having a converging section for being coupled to and receiving shop air, a throat section coupled to said converging section for accelerating the shop air, and a diverging section coupled to said throat section for receiving and focusing the shop air onto the workpiece to be cleaned, and
   means for injecting liquid $CO_2$ into the flow of the shop air adjacent to said throat section and thereby converting a substantial portion of said liquid $CO_2$ into solid $CO_2$ particles, whereby said $CO_2$ particles are accelerated by the shop air within said diverging section for impacting and cleaning but not deforming the pressure-sensitive workpiece.

9. The system for cleaning the pressure-sensitive workpiece as described in claim 8 wherein said means for injecting liquid $CO_2$ is spaced upstream from said throat section for injecting the $CO_2$ particles in a downstream direction, whereby the $CO_2$ particles are accelerated with the shop air passing through said throat section.

10. The system for cleaning the pressure-sensitive workpiece as described in claim 8 wherein said means for injecting liquid $CO_2$ is spaced downstream from said throat section for injecting the solid $CO_2$ particles directly into said diverging section, whereby said $CO_2$ particles are accelerated by the shop air after passing through said throat section.

11. The system for cleaning the pressure-sensitive workpiece as described in claim 8 wherein the solid $CO_2$ particles have a mean diameter less than 0.001 inches.

12. The system for cleaning the pressure-sensitive workpiece as described in claim 8 wherein the mass and momentum of the solid $CO_2$ particles accelerated by the carrier gas will not deform the pressure-sensitive workpiece upon impact.

13. The system for cleaning the pressure-sensitive workpiece as described in claim 8 wherein said means for injecting liquid $CO_2$ comprises a plurality of orifices in said first nozzle adjacent to said throat section thereof for directing the solid $CO_2$ particles into the flow of shop air through said first nozzle.

14. The system for cleaning the pressure-sensitive workpiece as described in claim 8 wherein said means for injecting liquid $CO_2$ comprises a circumferential slot in said first nozzle adjacent to said throat section thereof for directing the solid $CO_2$ particles into the flow of shop air through said first nozzle.

15. A method for generating small $CO_2$ particles for abrasively cleaning a workpiece, comprising the steps of:
   (a) accelerating a carrier gas from a converging section through a throat section and out a diverging section of a first nozzle, and
   (b) injecting liquid $CO_2$ through a $CO_2$ nozzle generally adjacent to the throat section for at least partially converting liquid $CO_2$ into solid $CO_2$ particles, whereby the solid $CO_2$ particles are accelerated by the carrier gas through the diverging section for cleaning the workpiece.

16. The $CO_2$ cleaning method as described in claim 15 wherein step (b) includes the step of (b1) isenthalpic converting the liquid $CO_2$ into $CO_2$ particles as it passes from the $CO_2$ nozzle.

17. The $CO_2$ cleaning method as described in claim 16 wherein step (b) includes the step of (b2) injecting the liquid $CO_2$ into the first nozzle adjacent to but upstream from the throat section, whereby the $CO_2$ particles are accelerated by the carrier gas moving through the throat section of the first nozzle.

18. The $CO_2$ cleaning method as described in claim 16 wherein step (b) includes the step of (b3) injecting the liquid $CO_2$ into the first nozzle adjacent to but downstream from the throat section, whereby the $CO_2$ particles are carried by the carrier gas moving through the diverging section of the first nozzle.

19. The $CO_2$ cleaning method as described in claim 15 wherein step (b) includes the step of (b4) isenthalpic converting the liquid $CO_2$ into $CO_2$ particles having an average diameter of less than 0.001 inches.

20. The $CO_2$ cleaning method as described in claim 15 wherein step (b) includes the step of (b5) of injecting the $CO_2$ particles at an acute angle of less than 40° with respect to the longitudinal axis of flow of the carrier gas through the first nozzle.

* * * * *